(12) United States Patent
Nishizawa et al.

(10) Patent No.: US 10,109,603 B2
(45) Date of Patent: Oct. 23, 2018

(54) SEMICONDUCTOR DEVICE

(71) Applicant: Fuji Electric Co., Ltd., Kanagawa (JP)

(72) Inventors: Tatsuo Nishizawa, Nagano (JP); Kyohei Fukuda, Tokyo (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/429,415

(22) Filed: Feb. 10, 2017

(65) Prior Publication Data

US 2017/0271280 A1  Sep. 21, 2017

(30) Foreign Application Priority Data

Mar. 15, 2016 (JP) .................. 2016-051642

(51) Int. Cl.
| | |
|---|---|
| *H01L 23/62* | (2006.01) |
| *H01L 23/31* | (2006.01) |
| *H01L 23/498* | (2006.01) |
| *H01L 25/07* | (2006.01) |
| *H01L 23/00* | (2006.01) |

(52) U.S. Cl.
CPC .......... *H01L 23/62* (2013.01); *H01L 23/3121* (2013.01); *H01L 23/49822* (2013.01); *H01L 23/49827* (2013.01); *H01L 25/072* (2013.01); *H01L 24/48* (2013.01)

(58) Field of Classification Search
None
See application file for complete search history.

(56) References Cited

U.S. PATENT DOCUMENTS

| | | |
|---|---|---|
| 8,441,806 B2 | 5/2013 | Tsukada et al. |
| 2004/0159962 A1 | 8/2004 | Ishiyama |
| 2014/0246783 A1* | 9/2014 | Nishizawa ............ H01L 25/072 257/774 |

FOREIGN PATENT DOCUMENTS

| | | | |
|---|---|---|---|
| DE | 2848995 A1 * | 5/1980 | ............ H01H 85/12 |
| JP | 2004-253548 A | 9/2004 | |
| JP | 2011-082303 A | 4/2011 | |
| JP | 2013-239697 A | 11/2013 | |
| JP | 5500963 B2 | 5/2014 | |
| JP | 2015-41676 A | 3/2015 | |

* cited by examiner

*Primary Examiner* — Charles Garber
*Assistant Examiner* — Xiaoming Liu
(74) *Attorney, Agent, or Firm* — Chen Yoshimura LLP

(57) ABSTRACT

A semiconductor device includes semiconductor elements and a multilayer substrate including an insulating plate and a circuit board on which the semiconductor elements are arranged that is arranged on the front surface of the insulating plate. The semiconductor device also includes a printed circuit board that is arranged facing a principal surface of the multilayer substrate and in which through holes are formed, as well as conductive posts that are inserted through the through holes and are electrically connected to the semiconductor elements via bonding materials. Furthermore, the semiconductor device includes fuses that are formed between the interior walls of the through holes and the outer peripheral surfaces of the conductive posts, are electrically connected to the printed circuit board via the conductive posts, and melt at a first temperature.

12 Claims, 5 Drawing Sheets

SEMICONDUCTOR DEVICE

BACKGROUND OF THE INVENTION

Technical Field

The present invention relates to a semiconductor device.

Background Art

Semiconductor devices that include power semiconductor elements are used in power converters and as switching devices. In such semiconductor devices, semiconductor elements such as insulated-gate bipolar transistors (IGBTs) and power metal-oxide-semiconductor field-effect transistors (MOSFETs) are connected together such that the overall semiconductor device can function as a switching device, for example.

One such type of semiconductor device includes: a multilayer substrate including an insulating plate in which a circuit board is formed on the front surface and a metal plate is formed on the rear surface; and semiconductor elements that are formed on the circuit board with solder interposed therebetween. The semiconductor elements are electrically connected to one another and to the circuit board via wires made of aluminum or the like (see Patent Document 1, for example).

In this type of semiconductor device, if an overcurrent starts to flow due to short-circuits or the like in the semiconductor elements, the wires melt and thus function as fuses against the overcurrent, thereby making it possible to prevent heat generation, damage, and the like due to the overcurrent.

However, semiconductor devices that include power semiconductor elements and have a structure in which instead of wires, conductive posts, for example, are arranged in through holes in a conductive supporting member (such as a printed circuit board) such that the semiconductor elements are electrically connected to one another and to the circuit board via the conductive posts have also been proposed (see Patent Document 2, for example).

RELATED ART DOCUMENTS

Patent Documents

Patent Document 1: Japanese Patent Application Laid-Open Publication No. 2013-239697
Patent Document 2: Japanese Patent Application Laid-Open Publication No. 2011-082303

SUMMARY OF THE INVENTION

However, semiconductor devices in which conductive posts formed in a conductive supporting member are used as the connection structures are more prone to heat generation, damage, and the like due to overcurrent because none of the structures melt when overcurrent flows.

Moreover, in order to prevent this heat generation, damage, and the like, it is necessary to form separate circuits or the like that function as fuses against overcurrent. However, giving the semiconductor device this functionality results in an increase in costs due to the need to provide additional regions in which to form the required circuits or the like, for example.

The present invention was made in view of these problems and aims to provide a semiconductor device that includes fuse functionality. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: a semiconductor element; a multilayer substrate including an insulating plate, and one or more circuit boards on a front surface of the insulating plate, the semiconductor element being disposed in a prescribed area on one of the one or more circuit boards; a printed circuit board positioned to face a principal surface, including the one or more circuit boards, of the multilayer substrate and in which a first through hole is formed at a position opposite to the semiconductor element; a first conductive post inserted into the first through hole and electrically connected to the semiconductor element via a bonding material; and a first fuse member disposed between an interior wall surface of the first through hole and an outer peripheral surface of the first conductive post and electrically connected to the first conductive post and to the printed circuit board, a melting temperature of the first fuse member being a first temperature.

The technology disclosed herein makes it possible to prevent heat generation, damage, and the like due to overcurrent in a semiconductor device, thereby making it possible to prevent decreases in the reliability of the semiconductor device. It is to be understood that both the foregoing general description and the following detailed description are exemplary and explanatory, and are intended to provide further explanation of the invention as claimed.

BRIEF DESCRIPTION OF THE DRAWINGS

FIG. 4A illustrates a normal operating state of the semiconductor device, and FIG. 4B illustrates a state is which overcurrent is flowing in the semiconductor device.

DETAILED DESCRIPTION OF EMBODIMENTS

Next, an embodiment will be described below with reference to figures.

Figure 1:
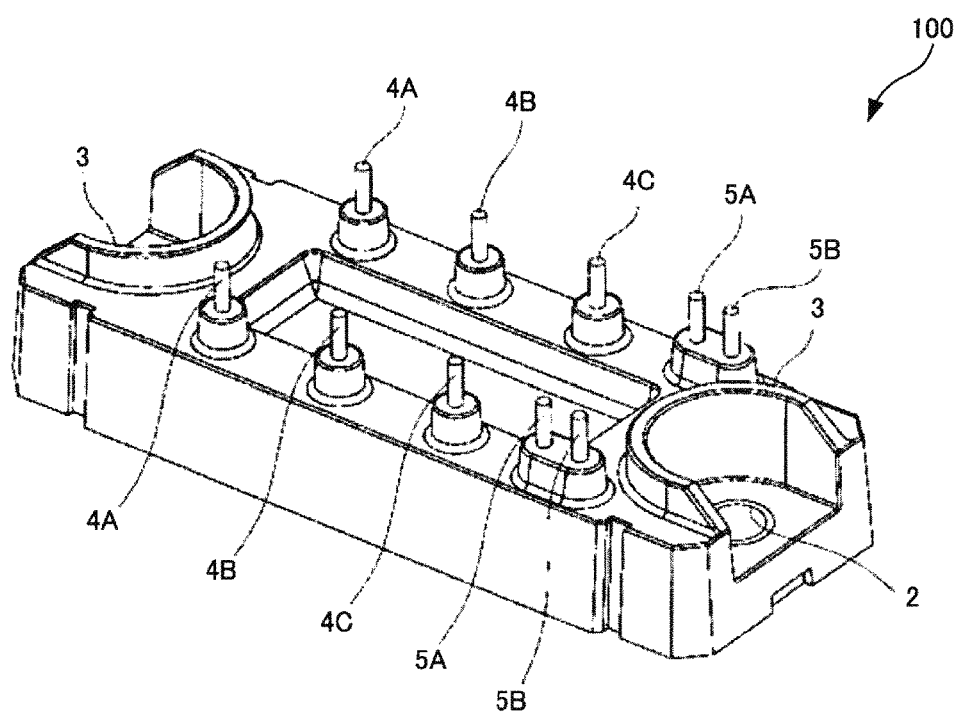
FIG. 1 is an exterior view of a semiconductor device according to an embodiment.

First, the exterior of a semiconductor device according to the embodiment will be described with reference to FIG. 1. FIG. 1 is an exterior view of a semiconductor device according to an embodiment.

As illustrated in FIG. 1, a semiconductor device 100 includes a molded body formed by molding a resin material such as an epoxy resin. In this semiconductor device 100, through holes 2 for inserting screws are formed in the left and right ends in FIG. 1, and insulating walls 3 that have a U-shape when viewed in a plan view are formed surrounding the through holes 2.

Furthermore, in the semiconductor device 100, external connection terminals 4A, 4B, and 4C and control terminals 5A and 5B that protrude upwards are respectively formed along both the front and rear edge sides of the upper surface between the left and right insulating walls 3.

Next, the configuration of the semiconductor device 100 will be described with reference to FIG. 2.

Figure 2:
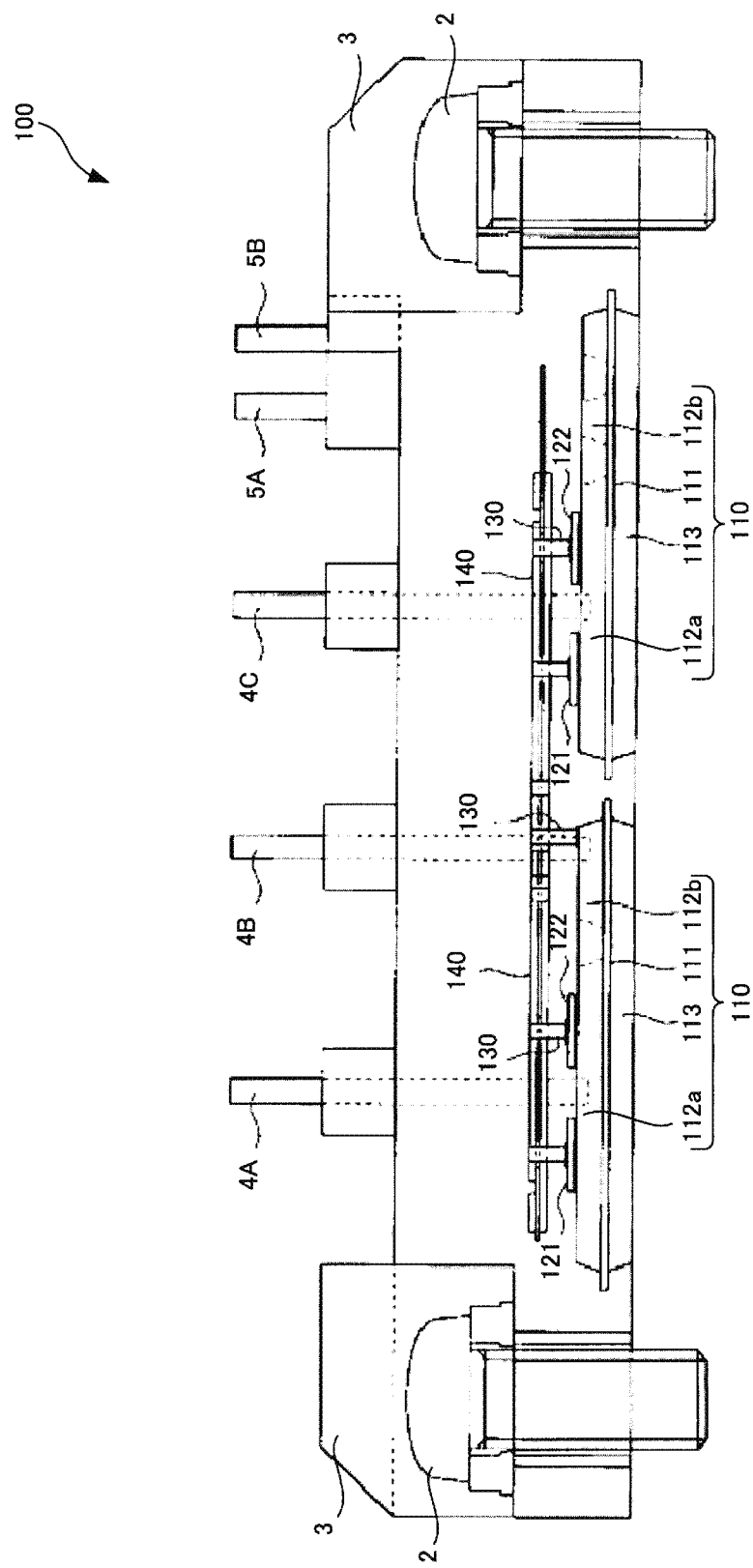
FIG. 2 is a side see-through view of the semiconductor device according to the embodiment.

FIG. 2 is a side see-through view of the semiconductor device according to the embodiment.

Note that in FIG. 2, the connection structures that connect conductive posts 130 to semiconductor elements 121 and 122 and to a circuit board 112b are illustrated in a simplified manner (all of these components will be described later). These connection structures will be described in more detail with reference to FIG. 3.

The semiconductor device 100 includes the semiconductor elements 121 and 122, a multilayer substrate 110 on which the semiconductor elements 121 and 122 are arranged, and a printed circuit board 140 arranged facing the multilayer substrate 110.

The semiconductor elements 121 are power semiconductor elements such as IGBTs (or power MOSFETs). The semiconductor elements 122 are free wheeling diodes (FWDs).

The multilayer substrate 110 includes an insulating plate 111, circuit boards 112a and 112b formed on the front surface of the insulating plate 111, and a metal plate 113 formed on the rear surface of the insulating plate 111.

The insulating plate 111 is made of a ceramic with good thermal conductivity such as alumina.

The circuit boards 112a and 112b are made of copper plates with a thickness of approximately 0.3 mm to 1 mm, for example. Moreover, the circuit board 112a has a pattern for mounting the semiconductor elements 121 and 122 and is connected to the external connection terminals 4A and 4C. Furthermore, the circuit board 112b is arranged at a prescribed distance away from the circuit board 112a, has a pattern for connecting to the conductive posts (described later), and is connected to the external connection terminals 4B.

The metal plate 113 has a thickness of approximately 0.3 mm to 1 mm, is made of a metal such as copper that exhibits high heat dissipation, for example, and is formed over the entire rear surface of the insulating plate 111.

In the printed circuit board 140, through holes are formed in prescribed positions, and the conductive posts 130 are inserted through these through holes. Conductive patterns that form current paths for primary circuits, gate wiring patterns that are connected to gate electrodes of the semiconductor elements 121 via the conductive posts 130, and emitter auxiliary terminal wires are formed on both surfaces of the printed circuit board 140. The gate wiring patterns are connected to terminal connection patterns that are connected to the control terminals 5B.

Furthermore, the external connection terminals 4A, 4B, and 4C are inserted through the printed circuit board 140 without making contact therewith.

In this way, the desired circuit configurations can be achieved using the multilayer substrate 110, the semiconductor elements 121 and 122, and the printed circuit board 140 in which the conductive posts 130 are formed.

Next, the connection structures that connect the semiconductor elements 121 and 122 to the conductive posts 130 that are inserted through the through holes in the printed circuit board 140 will be described in more detail with reference to FIG. 3.

Figure 3:
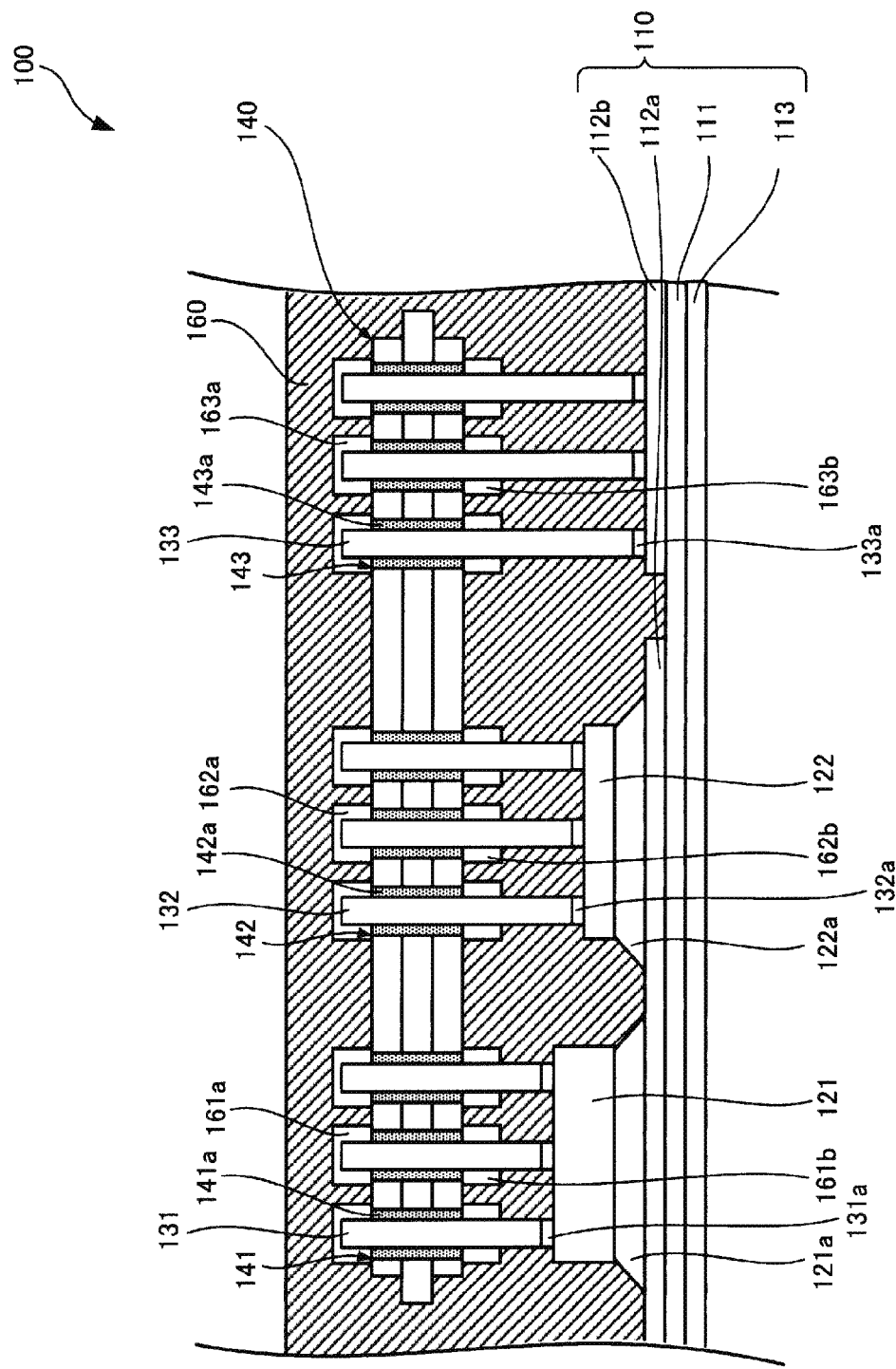
FIG. 3 is an enlarged cross-sectional view of the main components of the semiconductor device according to the embodiment.

FIG. 3 is an enlarged cross-sectional view of the main components of the semiconductor device according to the embodiment.

In FIG. 3, the main components of the semiconductor device 100 in a cross section taken along the lengthwise direction of the conductive posts 130 are enlarged and illustrated in more detail. Moreover, in order to simplify the description, the components illustrated in FIG. 3 are not necessarily illustrated exactly to scale relative to in the actual semiconductor device 100.

As described above, the semiconductor device 100 includes the multilayer substrate 110, the semiconductor elements 121 and 122, the printed circuit board 140, and conductive posts 131, 132, and 133 (these will be referred to collectively as "the conductive posts 130"), and all of these components are sealed within a sealing resin 160.

The semiconductor elements 121 and 122 are arranged on the circuit board 112a of the multilayer substrate 110 with solder 121a and 122a interposed therebetween.

Moreover, the semiconductor device 121 is thicker than the semiconductor device 122 and generates more heat, for example.

The printed circuit board 140 has through holes 141, 142, and 143 formed therein and is arranged facing the circuit boards 112a and 112b of the multilayer substrate 110. Moreover, the diameter of the through holes 141, 142, and 143 is greater than or equal to approximately 2.1 mm and less than or equal to approximately 4.5 mm, for example.

The conductive posts 131, 132, and 133 are respectively inserted through the through holes 141, 142, and 143, and the bottom ends of the conductive posts are respectively bonded to the semiconductor elements 121 and 122 and the circuit board 112b via bonding materials 131a, 132a, and 133a such as solder. Moreover, the diameter of the conductive posts 131, 132, and 133 is greater than or equal to approximately 0.1 mm and less than or equal to approximately 0.5 mm, for example.

Furthermore, fuses 141a and 142a (first fuses) and fuses 143a (second fuses) are respectively formed between the interior walls of the through holes 141, 142, and 143 and the outer peripheral surfaces of the conductive posts 131, 132, and 133. The thickness of the fuses 141a, 142a, and 143a (in the radial direction) is greater than or equal to approximately 1 mm and less than or equal to approximately 2 mm, for example.

The fuses 141a, 142a, and 143a electrically connect the conductive posts 131, 132, and 133 to the printed circuit board 140 and are made of a conductive metal material. Moreover, the fuses 141a and 142a are made of a material that melts at a first temperature, while the fuses 143a are made of a material that melts at a second temperature that is lower than the first temperature, as will be described in more detail next. The first temperature of the fuses 141a and 142a and the second temperature of the fuses 143a must at least be greater than the temperatures of the conductive posts 131, 132, and 133, respectively, when the semiconductor elements 121 and 122 of the semiconductor device 100 are operating at the maximum operating temperature of 175° C. (these temperatures are approximately 100° C. to 175° C. for the conductive posts 131 and 132 that are bonded to the semiconductor elements 121 and 122 and approximately 50° C. to 100° C. for the conductive posts 133 that are bonded to the circuit board 112b, for example). Meanwhile, the first temperature of the fuses 141a and 142a and the second temperature of the fuses 143a are also less than or equal to the temperatures that occur when the semiconductor device 100 generates excess heat due to overcurrent (these temperatures are approximately 180° C. to 690° C. for the conductive posts 131 and 132 that are bonded to the semiconductor elements 121 and 122 and approximately 150° C. to 500° C. for the conductive posts 133 that are bonded to the circuit board 112b, for example).

Examples of materials for the fuses 141a, 142a, and 143a include aluminum (melting point: 660° C.) and tin solders, for example. Examples of tin solders include Sn-13Sb (melting point: greater than or equal to 245° C., less than or equal to 300° C.), Sn-5Sb (melting point: greater than or equal to 236° C., less than or equal to 242° C.), eutectic Sn-5.3Ag (melting point: approximately 221° C.), Sn (melting point: approximately 221° C.), Sn—Ag—Cu-8In (melting point: approximately 200° C.), eutectic Sn-73Pb (melting point: approximately 183° C.), and Sn-58Bi (melting point: approximately 139° C.), for example.

The sealing resin 160 includes metal reservoirs 161a, 162a, and 163a constituted by spatial regions that have openings that cover the through holes 141, 142, and 143 (from the upper side in FIG. 3) and that include the upper ends of the conductive posts 131, 132, and 133. These metal reservoirs 161a, 162a, and 163a can be formed by placing hollow resin cylinders that have openings just in one end over the upper ends of the conductive posts 131, 132, and 133 such that the through holes 141, 142, and 143 are covered by those openings, and then filling in and curing the sealing resin 160, for example. In this way, the metal reservoirs 161a, 162a, and 163a are formed within the sealing resin 160.

Similarly, the sealing resin 160 includes metal reservoirs 161b, 162b, and 163b constituted by spatial regions that have openings that cover the through holes 141, 142, and 143 (from the bottom side in FIG. 3) and that include the conductive posts 131, 132, and 133. These metal reservoirs 161b, 162b, and 163b can be formed by inserting the conductive posts 131, 132, and 133 through the bottom surfaces of hollow resin cylinders that have openings just in one end such that the through holes 141, 142, and 143 are covered by those openings, and then filling in and curing the sealing resin 160, for example. In this way, the metal reservoirs 161b, 162b, and 163b are formed within the sealing resin 160.

The metal reservoirs 161a, 162a, 163a, 161b, 162b, and 163b have a cylindrical shape, for example. However, as long as the through holes 141, 142, and 143 are covered (from both the lower and upper sides) by the openings, the metal reservoirs 161a, 162a, 163a, 161b, 162b, and 163b are not limited to having a cylindrical shape and may instead have a prismatic shape, a circular cone shape, or a polygonal cone shape.

Moreover, for the metal reservoirs 161a, 162a, 163a, 161b, 162b, and 163b, any configuration in which at least one of the upper metal reservoirs 161a, 162a, and 163a and the lower metal reservoirs 161b, 162b, and 163b (that is, upper and lower as illustrated in FIG. 3) are formed for the conductive posts 131, 132, and 133 is possible. Furthermore, a single overall metal reservoir may be respectively formed for each of the groups of the conductive posts 131, 132, and 133.

Next, a state in which overcurrent begins to flow while the semiconductor device 100 configured as described above is operating will be described with reference to FIGS. 4A and 4B.

Figure 4A:
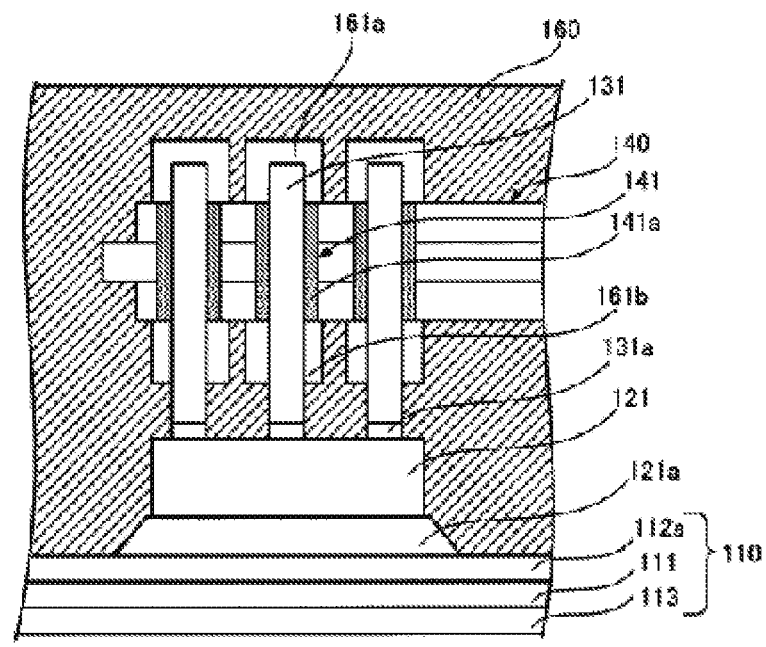
FIGS. 4A and 4B are drawings for explaining the fuse functionality of the semiconductor device according to the embodiment.
Figure 4B:
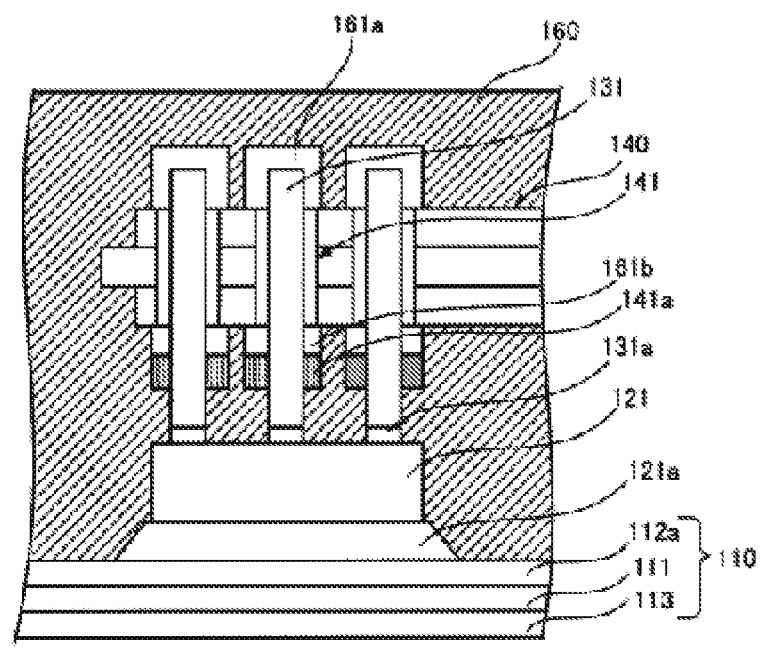

FIGS. 4A and 4B are drawings for explaining the fuse functionality of the semiconductor device according to the embodiment.

FIGS. 4A and 4B are enlarged views of a region around the semiconductor element 121, for example, in the semiconductor device 100, and here the state of the conductive posts 131 that are bonded to the semiconductor element 121 will be described as an example.

FIG. 4A illustrates a normal operating state of the semiconductor device 100, and FIG. 4B illustrates a state is which overcurrent is flowing in the semiconductor device 100.

As described above, the first temperature of the fuses 141a is greater than the normal operating temperature of the semiconductor device 100 but less than or equal to the temperature of the semiconductor device 100 when overcurrent occurs. Therefore, as illustrated in FIG. 4A, while a normal current is flowing through the semiconductor device 100, the fuses 141a do not melt even if heated and remain arranged between the conductive posts 131 and the through holes 141, thereby maintaining an electrical connection between the conductive posts 131 and the printed circuit board 140.

Meanwhile, when overcurrent occurs in the semiconductor device 100 and this overcurrent passes through the conductive posts 131, the overcurrent also passes through the fuses 141a and causes heat to be generated. When the temperature of the fuses 141a becomes greater than the first temperature due to this heat generation, the fuses 141a melt.

As illustrated in FIG. 4B, the melted fuses 141a flow into and are collected in the metal reservoirs 161b, for example. When this happens, the electrical connections between the conductive posts 131 and the printed circuit board 140 are severed, thereby preventing overcurrent from flowing between the conductive posts 131 and the printed circuit board 140. In this way, the fuses 141a formed between the through holes 141 and the conductive posts 131 provide a fuse functionality against overcurrent.

The description above applies not only to the conductive posts 131 but also to the fuses 142a and 143a for the conductive posts 132 and 133 when overcurrent occurs.

As described above, the semiconductor device 100 includes the semiconductor elements 121 and 122 and the multilayer substrate 110 including the insulating plate 111 and the circuit board 112a on which the semiconductor elements 121 and 122 are arranged that is arranged on the front surface of the insulating plate 111. The semiconductor device 100 also includes the printed circuit board 140 that is arranged facing the principal surface of the multilayer substrate 110 and in which the through holes 141 and 142 are formed, as well as the conductive posts 131 and 132 that are inserted through the through holes 141 and 142 and are electrically connected to the semiconductor elements 121 and 122 via the bonding materials 131a and 132a. Furthermore, the semiconductor device 100 includes the fuses 141a and 142a that are formed between the interior walls of the through holes 141 and 142 and the outer peripheral surfaces of the conductive posts 131 and 132, are electrically connected to the printed circuit board 140 via the conductive posts 131 and 132, and melt at a first temperature.

Meanwhile, the semiconductor device 100 also includes the conductive posts 133 that are inserted through the through holes 143 and are electrically connected to the circuit board 112*b* via the bonding materials 133*a*. The semiconductor device 100 also includes the fuses 143*a* that are formed between the interior walls of the through holes 143 and the outer peripheral surfaces of the conductive posts 133, are electrically connected to the printed circuit board 140 via the conductive posts 133, and melt at a second temperature that is lower than the first temperature.

When overcurrent occurs in this semiconductor device 100, that overcurrent flows through the fuses 141*a*, 142*a*, and 143*a*, thereby causing the fuses 141*a*, 142*a*, and 143*a* to melt. This severs the electrical connections between the conductive posts 131, 132, and 133 and the printed circuit board 140, thereby preventing overcurrent from flowing therebetween. Therefore, the semiconductor device 100 makes it possible to reduce cost increases as well as prevent damage or the like due to overcurrent without having to form separate circuits that have fuse functionality, thereby making it possible to reduce decreases in the reliability of the device.

In the semiconductor device 100, the semiconductor elements 121 and 122 reach a higher temperature than the circuit board 112*b* (on which no semiconductor elements are arranged). In other words, the conductive posts 131 and 132 that are respectively bonded to the semiconductor elements 121 and 122 will generally reach higher temperatures than the conductive posts 133 that are bonded to the circuit board 112*b*. Therefore, the first temperature of the fuses 141*a* and 142*a* for the conductive posts 131 and 132 that are bonded to the semiconductor elements 121 and 122 is set to a higher value than the second temperature of the fuses 143*a* of the conductive posts 133 that are only bonded to the circuit board 112*b*. This makes it possible to ensure that the fuses 141*a*, 142*a*, and 143*a* that are arranged between the interior walls of the through holes 141, 142, and 143 and the outer peripheral surfaces of the conductive posts 131, 132, and 133 only exhibit fuse functionality for the appropriate levels of overcurrent.

Next, the fuses 141*a*, 142*a*, and 143*a* of the semiconductor device 100 will be described with reference to FIGS. 5A and 5B.

Figure 5A:
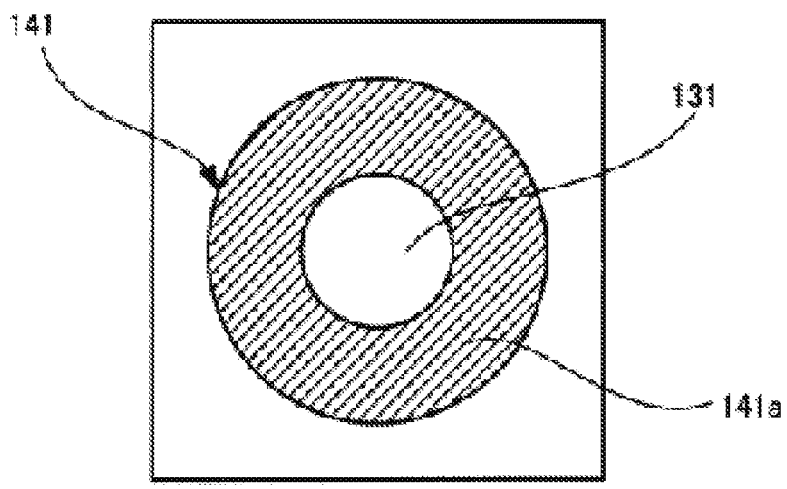
FIGS. 5A and 5B are top views of different fuses of the semiconductor device according to the embodiment.
Figure 5B:
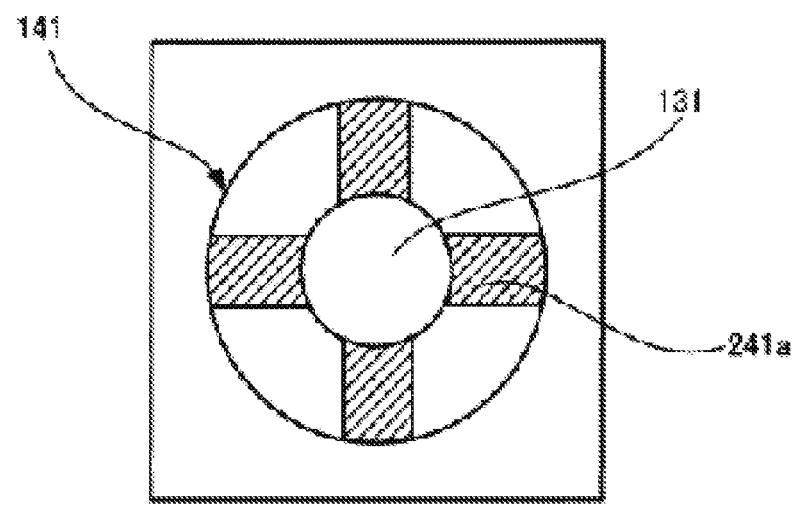

FIGS. 5A and 5B are top views of a fuse of the semiconductor device according to the embodiment.

Here, the fuse 141*a* illustrated in FIG. 5A will be described as an example.

FIG. 5A is a top view of the fuse 141*a*, and FIG. 5B is a top view of another fuse.

As illustrated in FIG. 5A, the fuse 141*a* described in the present embodiment is formed around the entire gap between the conductive post 131 and the through hole 141.

Meanwhile, in FIG. 5B, a substantially cross-shaped fuse 241*a* that is centered about the conductive post 131 is arranged between the conductive post 131 and the through hole 141. Here, the fuse 241*a* is made of a material with lower electrical resistivity than the conductive post 131, and this fuse 241*a* generates heat due to electrical resistance when overcurrent flows therethrough. When conductive post 131 is made of copper, for example, the fuse 241*a* is made of a tin solder or the like. In FIG. 5B, the fuse 241*a* is only partially formed in the through hole 141 in order to ensure that the fuse 241*a* will melt more reliably due to the heat generated by electrical resistance when overcurrent occurs. This also increases the current density of the current that flows through the fuse 241*a*, thereby resulting in generation of more heat due to electrical resistance.

Moreover, in FIG. 5B, the fuse 241*a* is formed in a substantially cross-shaped shape that is divided into four portions. However, the fuse 241*a* may instead be divided into less than four portions or more than four portions and may also be formed in any other shape that allows current to flow (such as a ball shape or a cylinder shape).

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention

What is claimed is:

1. A semiconductor device, comprising:
   a semiconductor element;
   a multilayer substrate including an insulating plate, and one or more circuit boards on a front surface of the insulating plate, said semiconductor element being disposed in a prescribed area on one of the one or more circuit boards;
   a printed circuit board positioned to face a principal surface, including said one or more circuit boards, of the multilayer substrate, the printed circuit board having a first through hole that penetrates the printed circuit board at a position opposite to the semiconductor element;
   a first conductive post inserted into the first through hole of the printed circuit board such that a space of about 1 mm or greater is provided between an outer peripheral surface of the first conductive post that is inserted into the first through hole and an interior wall surface of the first through hole, a bottom end of the first conductive post being electrically connected to the semiconductor element via a bonding material; and
   a first fuse member disposed in, and filling in at least a portion of, said space of about 1 mm or greater between the interior wall surface of the first through hole and the outer peripheral surface of the first conductive post and electrically connected to the first conductive post and to the printed circuit board, a melting temperature of said first fuse member being a first temperature.

2. The semiconductor device according to claim 1, wherein the first temperature is greater than a temperature of the first conductive post when the semiconductor device is operating at a maximum operating temperature and less than or equal to a temperature of the first conductive post when heat is generated by an overcurrent in the semiconductor device.

3. The semiconductor device according to claim 2, wherein the temperature of the first conductive post when the semiconductor device is operating at the maximum operating temperature is 100° C. to 175° C.

4. The semiconductor device according to claim 2, wherein the temperature of the first conductive post when heat is generated by the overcurrent is 150° C. to 690° C.

5. The semiconductor device according to claim 1, wherein the first fuse member is made of tin solder or aluminum.

6. The semiconductor device according to claim 1, further comprising:
   a sealing resin sealing the semiconductor element, the multilayer substrate, the printed circuit board, and the first conductive post and including a metal reservoir comprising an open region that covers the first through hole.

7. The semiconductor device according to claim 1, wherein the printed circuit board further has a second through hole that penetrates the printed circuit board at a position opposite to another one of said one or more circuit boards, and wherein the semiconductor device further includes:
a second conductive post inserted into the second through hole of the printed circuit board such that a space of about 1 mm or greater is provided between an outer peripheral surface of the second conductive post that is inserted into the second through hole and an interior wall surface of the second through hole, a bottom end of the second conductive post being electrically connected to said another of said one or more circuit boards via a bonding material; and a second fuse member disposed in, and filling in at least a portion of, said space of about 1 mm or greater between the interior wall surface of the second through hole and the outer peripheral surface of the second conductive post and electrically connected to the second conductive post and to the printed circuit board, a melting temperature of said second fuse member being a second temperature that is lower than the first temperature.

8. The semiconductor device according to claim 7, wherein the second temperature is greater than a temperature of the second conductive post when the semiconductor device is operating at the maximum operating temperature and less than or equal to a temperature of the second conductive post when heat is generated by the overcurrent in the semiconductor device.

9. The semiconductor device according to claim 8, wherein the temperature of the second conductive post when the semiconductor device is operating at the maximum operating temperature is 50° C. to 100° C.

10. The semiconductor device according to claim 9, wherein the temperature of the second conductive post when heat is generated by the overcurrent is 100° C. to 500° C.

11. The semiconductor device according to claim 7, wherein the second fuse member is made of tin solder.

12. The semiconductor device according to claim 7, further comprising:
a sealing resin sealing the semiconductor element, the multilayer substrate, the printed circuit board, and the second conductive post and including a metal reservoir comprising an open region that covers the second through hole.

* * * * *